United States Patent
Kim

(10) Patent No.: US 7,304,531 B2
(45) Date of Patent: Dec. 4, 2007

(54) INTERNAL VOLTAGE GENERATOR

(75) Inventor: Yong-Kyu Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/181,008

(22) Filed: Jul. 12, 2005

(65) Prior Publication Data

US 2006/0220729 A1    Oct. 5, 2006

(30) Foreign Application Priority Data

Mar. 31, 2005    (KR) ............... 10-2005-0027372

(51) Int. Cl.
*G05F 1/10*    (2006.01)
(52) U.S. Cl. .................. 327/536; 363/60
(58) Field of Classification Search ........ 327/534, 327/535, 536, 537; 363/60, 63
See application file for complete search history.

(56) References Cited

U.S. PATENT DOCUMENTS

| | | | | |
|---|---|---|---|---|
| 5,841,725 A * | 11/1998 | Kang et al. | ............ | 365/226 |
| 5,852,552 A * | 12/1998 | Kwon | ............ | 363/60 |
| 6,137,343 A * | 10/2000 | Matano | ............ | 327/535 |
| 6,225,854 B1 * | 5/2001 | Cha | ............ | 327/536 |
| 6,356,501 B2 * | 3/2002 | Park et al. | ............ | 365/226 |
| 6,429,725 B1 * | 8/2002 | Tanzawa et al. | ............ | 327/536 |
| 6,459,643 B2 * | 10/2002 | Kondo et al. | ............ | 365/226 |
| 6,522,191 B1 * | 2/2003 | Cha et al. | ............ | 327/536 |
| 6,580,312 B1 * | 6/2003 | Kim | ............ | 327/536 |
| 6,584,032 B2 * | 6/2003 | Fujioka et al. | ............ | 365/227 |
| 6,724,242 B2 * | 4/2004 | Kim et al. | ............ | 327/536 |
| 6,784,723 B2 * | 8/2004 | Lee et al. | ............ | 327/536 |
| 6,876,247 B2 * | 4/2005 | Jang et al. | ............ | 327/536 |
| 7,102,425 B2 * | 9/2006 | Lee | ............ | 327/589 |
| 7,132,902 B2 * | 11/2006 | Ricard et al. | ............ | 331/176 |
| 7,142,039 B2 * | 11/2006 | Cheung et al. | ............ | 327/536 |
| 2005/0168263 A1 * | 8/2005 | Fukuda et al. | ............ | 327/535 |
| 2006/0097773 A1 * | 5/2006 | Kang et al. | ............ | 327/536 |

FOREIGN PATENT DOCUMENTS

| KR | 1998-044334 | 9/1998 |
|---|---|---|
| KR | 1998-082678 | 12/1998 |

\* cited by examiner

*Primary Examiner*—Kenneth B. Wells
*Assistant Examiner*—Thomas J. Hiltunen
(74) *Attorney, Agent, or Firm*—Blakely, Sokoloff, Taylor & Zafman

(57) ABSTRACT

Provided is an internal voltage generator for preventing an occurrence of leakage current while a charge pumping is not performed. The internal voltage generator includes: a charge pumping unit for pumping an external voltage to generate a high voltage higher than the external voltage; a level detecting unit for detecting a level drop of the high voltage with respect to a reference voltage and outputting a detection signal; an oscillating unit for generating an oscillation signal in response to the detection signal; a pumping control signal generating unit for controlling a driving of the charge pumping unit in response to the oscillation signal; and a charge pump controlling unit for precharging the charge pumping unit in response to the detection signal.

8 Claims, 7 Drawing Sheets

INTERNAL VOLTAGE GENERATOR

FIELD OF THE INVENTION

The present invention relates to a semiconductor design technology; and, more particularly, to an internal voltage generator for preventing an occurrence of leakage current while a charge pumping is not performed.

DESCRIPTION OF RELATED ART

An internal voltage generator is used as an internal voltage source in a semiconductor memory device. The internal voltage generator receives an external voltage (VCC) to generate internal voltages of various levels.

As the semiconductor memory device tends to be low power and low power consumption, the internal voltage generator is employed in DRAM products.

Many attempts to generate stable internal voltages regardless of supply voltage, process or temperature change have been made.

FIG. 1 is a block diagram of a conventional internal voltage generator.

Referring to FIG. 1, the conventional internal voltage generator includes a reference voltage generating unit 10, a level shifter 20, a level detector 30, an oscillator 40, a pumping control signal generating unit 50, and a charge pumping unit 60.

The reference voltage generator 10 generates a reference voltage VREF with respect to a high voltage VPP, and the level shifter 20 supplies a shifting reference voltage VR1 having a level corresponding to the reference voltage VREF. The level detector 30 detects a level drop of the high voltage VPP with respect to the reference voltage VR1 and generates a detection signal PPE. The oscillator 40 generates an oscillation signal OSC in response to the detection signal PPE. The pumping control signal generating unit 50 controls a driving of the charge pumping unit 60 in response to the oscillation signal OSC. The charge pumping unit 60 pumps a power supply voltage VCC to generate the high voltage VPP having a level higher than the power supply voltage VCC.

In the conventional internal voltage generator, the level detector 30 detects a level drop of the high voltage VPP and the charge pumping unit 60 is driven by the oscillator 40 and the pumping control signal generator 50. Therefore, the high voltage VPP is maintained at a constant level.

The charge pumping unit 60 is implemented with a doubler charge pump.

FIG. 2 is a circuit diagram of the charge pumping unit 60 shown in FIG. 1.

Referring to FIG. 2, a capacitor C1 has one terminal receiving a pumping control signal P1 and the other terminal connected to a node P1_BT, and a capacitor C3 has one terminal receiving a pumping control signal P2 and the other terminal connected to a node P2_BT. A PMOS transistor PM2 has a gate receiving a voltage of the node P1_BT and a source-drain path between a high voltage (VPP) terminal and the node P2_BT. A PMOS transistor PM1 has a gate receiving a voltage of the node P2_BT and a source-drain path between the VPP terminal and the node P1_BT. A capacitor C2 has one terminal receiving a pumping control signal G1 and the other terminal connected to a node G1_BT. A capacitor C4 has one terminal receiving a pumping control signal G2 and the other terminal connected to a node G2_BT. An NMOS transistor NM1 has a gate receiving a voltage of the node G1_BT and a drain-source path between the node P1_BT and a power supply (VCC) terminal. An NMOS transistor NM2 has a gate receiving a voltage of the node G2_BT and a drain-source path between the node P2_BT and the VCC terminal. An NMOS transistor NM3 has a drain connected to the node G1_BT, and a source and gate connected to the source of the NMOS transistor NM11. An NMOS transistor NM4 has a drain and a gate connected to the node G1_BT, and a source connected to the source of the NMOS transistor NM1. An NMOS transistor NM5 has a drain connected to the node G2_BT, and a source and a gate connected to the source of the NMOS transistor NM2. An NMOS transistor NM6 has a drain and a gate connected to the node G2_BT, and a source connected to the source of the NMOS transistor NM2.

An operation of the charge pumping unit 60 will be described in brief with reference to FIG. 2.

First, when the pumping control signal P1 changes from the ground voltage VSS to the power supply voltage VCC, the voltage level of the node P1_BT is increased from the power supply voltage VCC to a voltage of 2VCC by the capacitor C1 receiving the pumping control signal P1.

Since the pumping control signal P2 changes from the power supply voltage VCC to the ground voltage VSS, the voltage level of the node P2_BT is equal to the power supply voltage VCC.

Accordingly, the PMOS transistor PM1 receiving the voltage level of the node P2_BT through its gate is turned on, and the VPP terminal is driven by the voltage of 2VCC, which is applied on the node P1_BT. Like this, due to the turned-on PMOS transistor PM1, the VPP terminal has the same voltage level as the node P1_BT.

Then, when the pumping control signal G2 changes from the ground voltage VSS to the power supply voltage VCC, the voltage level of the node G2_BT is increased from the power supply voltage VCC to the voltage of 2VCC by the capacitor C4 receiving the pumping control signal G2.

Accordingly, the NMOS transistor NM2 receiving the voltage level of the node G2_BT through its gate is turned on, the node P2_BT is precharged to the power supply voltage VCC.

Then, the pumping control signal G2 changes from the power supply voltage VCC to the ground voltage VSS, so that the NMOS transistor NM2 is turned off.

Also, when the pumping control signal P1 changes from the power supply voltage VCC to the ground voltage VSS, the voltage level of the node P2_BT is equal to the voltage of 2VCC.

Accordingly, the PMOS transistor PM2 receiving the voltage level of the node P1_BT through its gate is turned on, so that the VPP terminal is driven by the voltage of the node P2_BT. This is performed until the VPP terminal has the same level as the voltage of the node P2_BT.

Then, when the pumping control signal G1 changes from the ground voltage VSS to the power supply voltage VCC, the node G1_BT is pumped from the power supply voltage VCC to the voltage level of 2VCC and thus the NMOS transistor NM1 receiving the pumping control signal G1 is turned on.

Accordingly, the turned-on NMOS transistor NM1 precharges the node P1_BT to the power supply voltage VCC.

The pumping control signal G1 changes from the power supply voltage VCC to the ground voltage VSS, so that the NMOS transistor NM1 is turned off.

The above-described procedures are repeated as one period, and the high voltage VPP higher than the external power supply voltage VCC is supplied.

In the device supplied with the high voltage VPP, however, there is no current consumption with respect to the high voltage VPP. Therefore, when the level of the power supply voltage VCC is dropped while the pumping control signal is not generated, leakage current occurs from the VPP terminal.

For example, during a time period when the PMOS transistor PM2 is turned on and the VPP terminal is driven by the voltage of the node P2_BT, the node G1_BT has a level of VCC+Vt and the node G2_BT has a level of VCC−Vth.

At this time, if the level of the high voltage is greater than the shifting reference voltage, the detection signal is deactivated so that the respective nodes maintain the current level.

However, when the level of the power supply voltage VCC is dropped due to external factors, the NMOS transistor NM2 is turned on and thus the path is formed between the node P2_BT and the VCC terminal. Accordingly, leakage current is generated with respect to the high voltage.

SUMMARY OF THE INVENTION

It is, therefore, an object of the present invention to provide an internal voltage generator that is capable of stably maintaining the level of the internal voltage even though a level of an external voltage is unstable while a pumping operation is not performed.

In accordance with an aspect of the present invention, there is provided an internal voltage generator, including: a charge pumping unit for pumping an external voltage to generate a high voltage higher than the external voltage; a level detecting unit for detecting a level drop of the high voltage with respect to a reference voltage and outputting a detection signal; an oscillating unit for generating an oscillation signal in response to the detection signal; a pumping control signal generating unit for controlling a driving of the charge pumping unit in response to the oscillation signal; and a charge pump controlling unit for precharging the charge pumping unit in response to the detection signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 1:
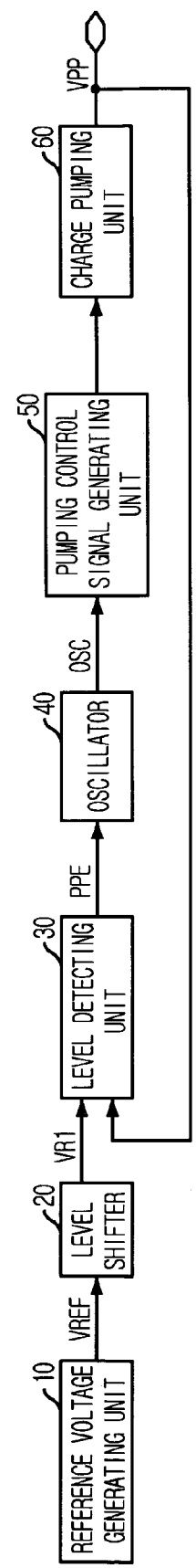
FIG. 1 is a block diagram of a conventional internal voltage generator.
Figure 2:
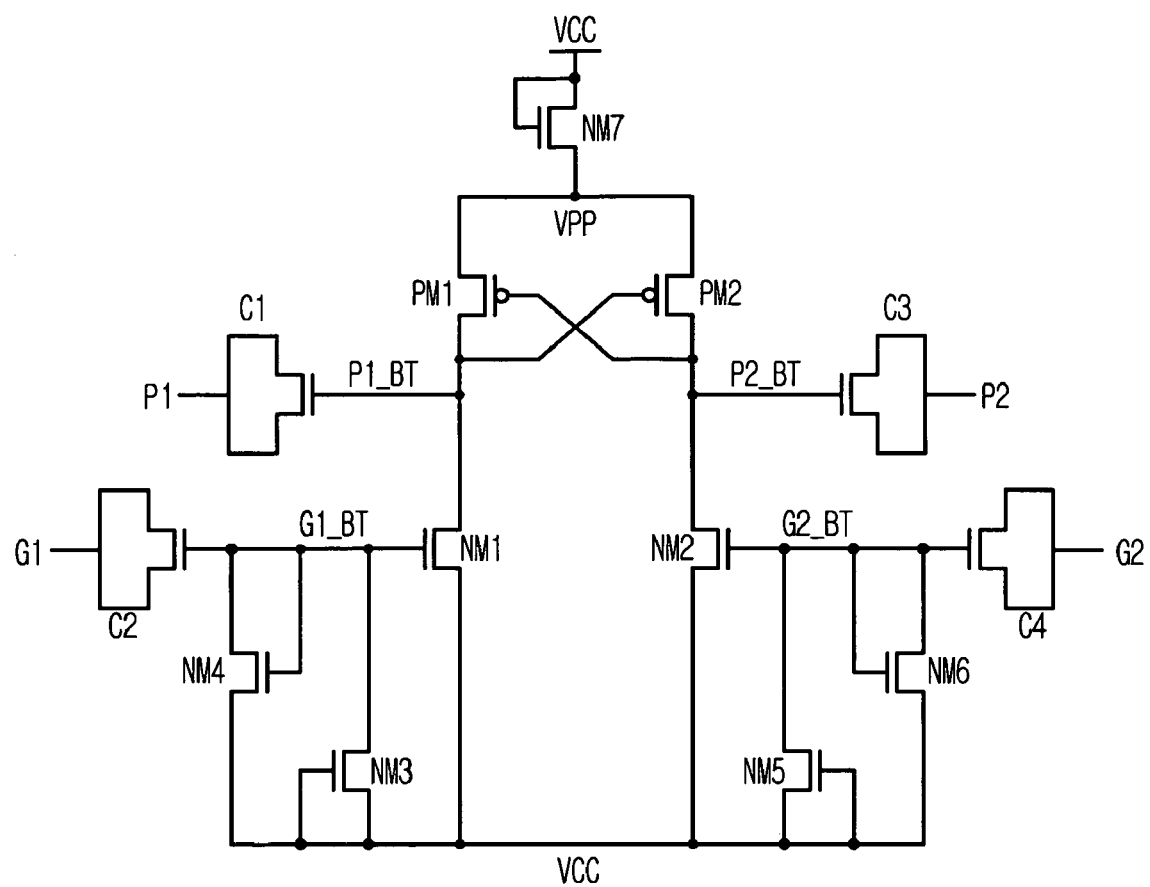
FIG. 2 is a circuit diagram of a charge pumping unit shown in FIG. 1.
Figure 3:
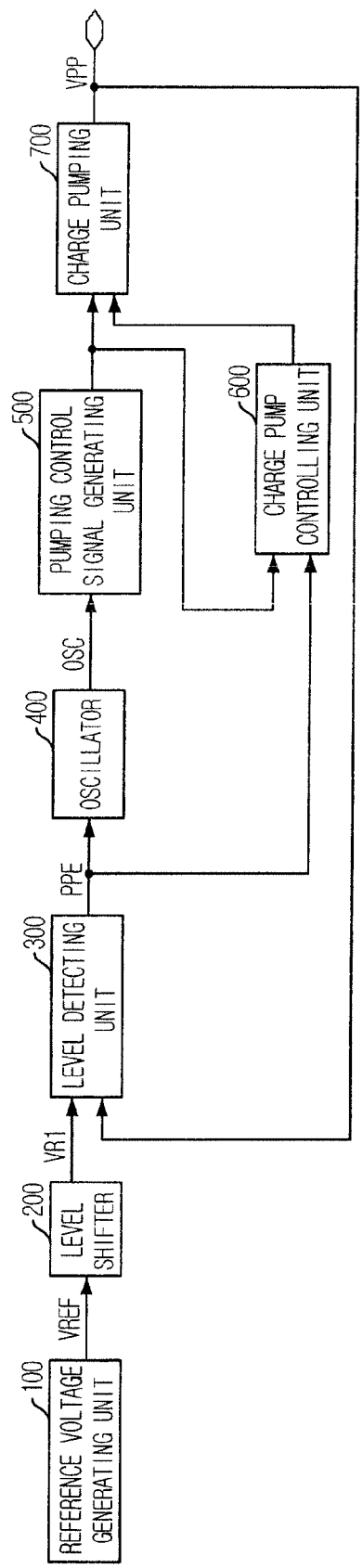
FIG. 3 is a block diagram of an internal voltage generator in accordance with an embodiment of the present invention.

FIG. 3 is a block diagram of an internal voltage generator in accordance with an embodiment of the present invention.

Referring to FIG. 3, the internal voltage generator includes a reference voltage generating unit 100, a level shifter 200, a level detector 300, an oscillator 400, a pumping control signal generating unit 500, a charge pump controlling unit 600, and a charge pumping unit 700.

The reference voltage generator 100 generates a reference voltage VREF with respect to a high voltage VPP, and the level shifter 200 supplies a shifting reference voltage VR1 having a level corresponding to the reference voltage VREF. The level detector 300 detects a level drop of the high voltage VPP with respect to the reference voltage VR1 and generates a detection signal PPE. The oscillator 400 generates an oscillation signal OSC in response to the detection signal PPE. The pumping control signal generating unit 500 controls a driving of the charge pumping unit 700 in response to the oscillation signal OSC. The charge pump controlling unit 600 precharges the charge pumping unit 700 in response to the detection signal PPE. The charge pumping unit 700 pumps a power supply voltage VCC to generate the high voltage VPP having a level higher than the power supply voltage VCC.

In accordance with the present invention, the internal voltage generator further includes the charge pump controlling unit 600, so that the level of the high voltage VPP is stably maintained even though the level of the power supply voltage VCC is dropped when the charge pumping unit 700 is not driven.

Figure 4:
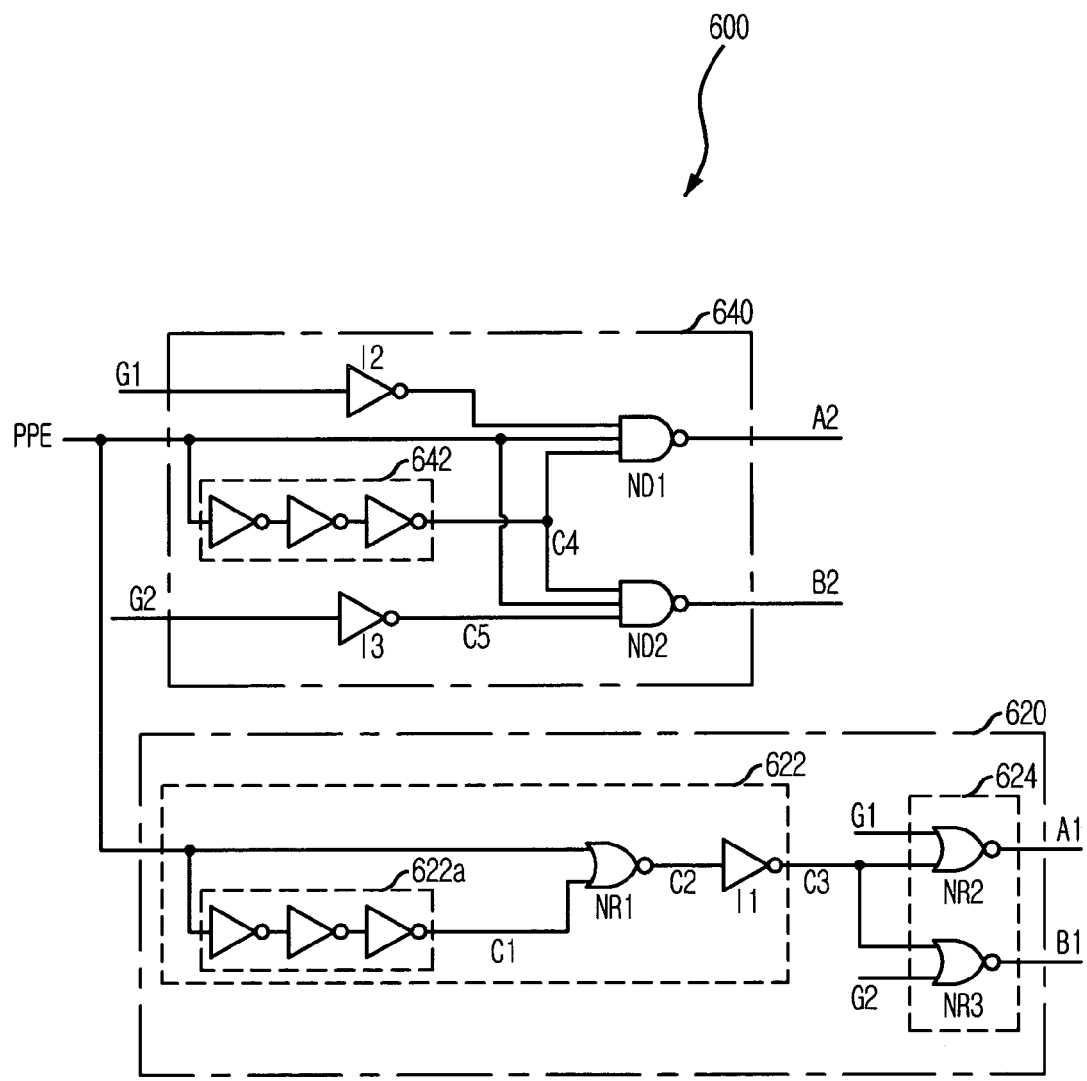
FIG. 4 is a circuit diagram of a charge pump controlling unit shown in FIG. 3.

FIG. 4 is a circuit diagram of the charge pump controlling unit 600 shown in FIG. 3.

Referring to FIG. 4, the charge pump controlling unit 600 includes a first control signal generator 620 and a second control signal generator 640.

The first control signal generator 620 detects a driving end of the charge pumping unit 700 and generates precharge control signals A1 and B1 for opening a path where leakage current occurs in the charge pumping unit 700. The second control signal generator 640 detects a driving start of the charge pumping unit 700 and generates initialization control signals A2 and B2 for initializing the charge pumping unit 700

Also, the first control signal generator 620 includes an edge detecting unit for detecting a deactivation of the detection signal PPE, and an output controlling unit 624 for outputting the signals outputted from the edge detecting unit 662 as the precharge control signals A1 and B1 under control of the pumping control signals G1 and G2.

The edge detecting unit 622 includes a delaying-inverting unit 622a for delaying and inverting the detection signal PPE, a NOR gate NR1 receiving an output of the delaying-inverting unit 622a and the detection signal PPE, and an inverter I1 for inverting an output of the NOR gate NR1.

The output controlling unit 624 includes a NOR gate NR2 receiving the output of the edge detecting unit 622 and the pumping control signal G1 to output the precharge control signal A1 and a NOR gate NR3 receiving the output of the edge detecting unit 622 and the pumping control signal G2 to output the precharge control signal A2.

The second control signal generator 640 detects the driving start of the charge pumping unit 700 through the activation of the detection signal PPE and generates the initialization control signals A2 and B2 for initializing the charge pumping unit 700.

The second control signal generator 640 includes a delaying-inverting unit 642 for delaying and inverting the detection signal PPE, a NAND gate ND1 receiving an output of the delaying-inverting unit 642, the detection signal PPE and the inverted pumping control signal G1 and generating the initialization control signal A2, and a NAND gate ND2 receiving the output of the delaying-inverting unit 642, the detection signal PPE and the inverted pumping control signal G2 and generating the initialization control signal B2.

Figure 5A:
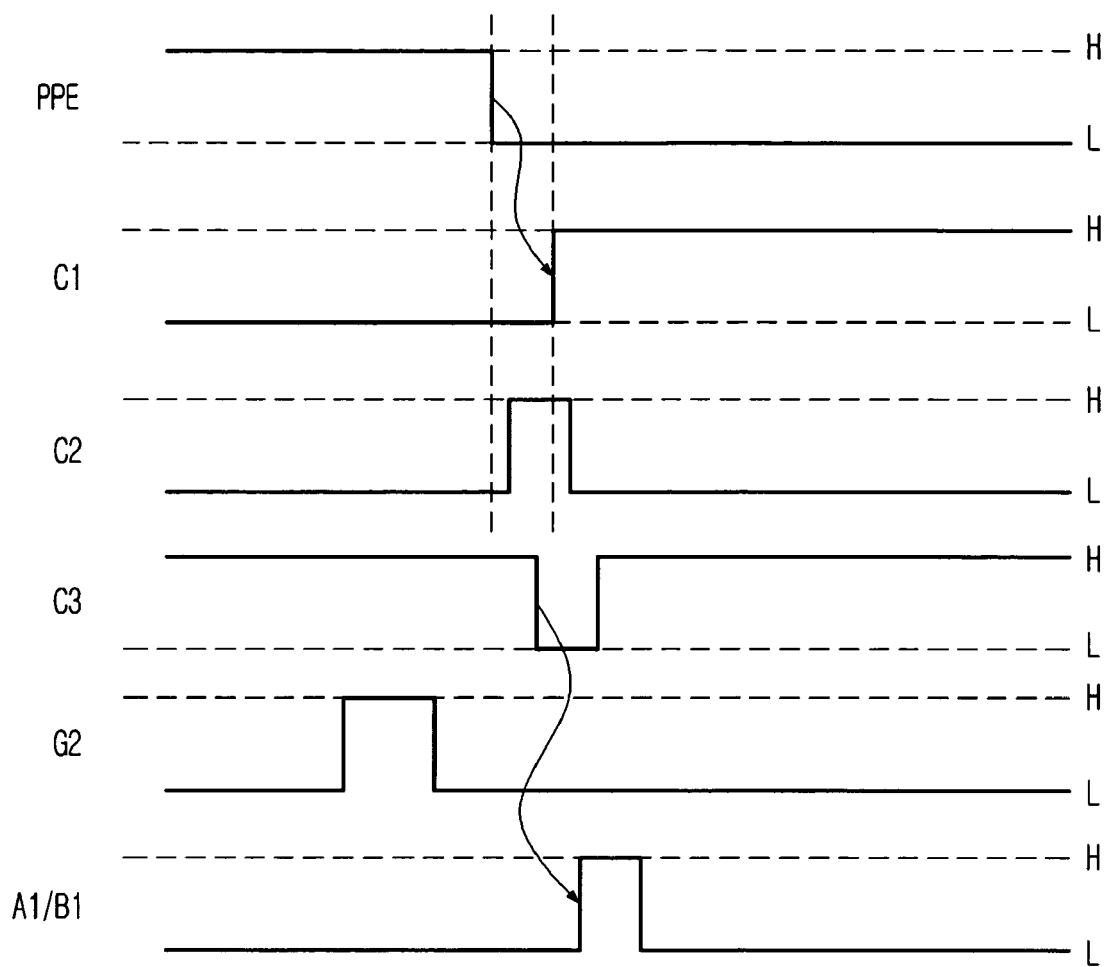
FIGS. 5A and 5B are waveforms of the charge pump controlling unit shown in FIG. 4.
Figure 5B:
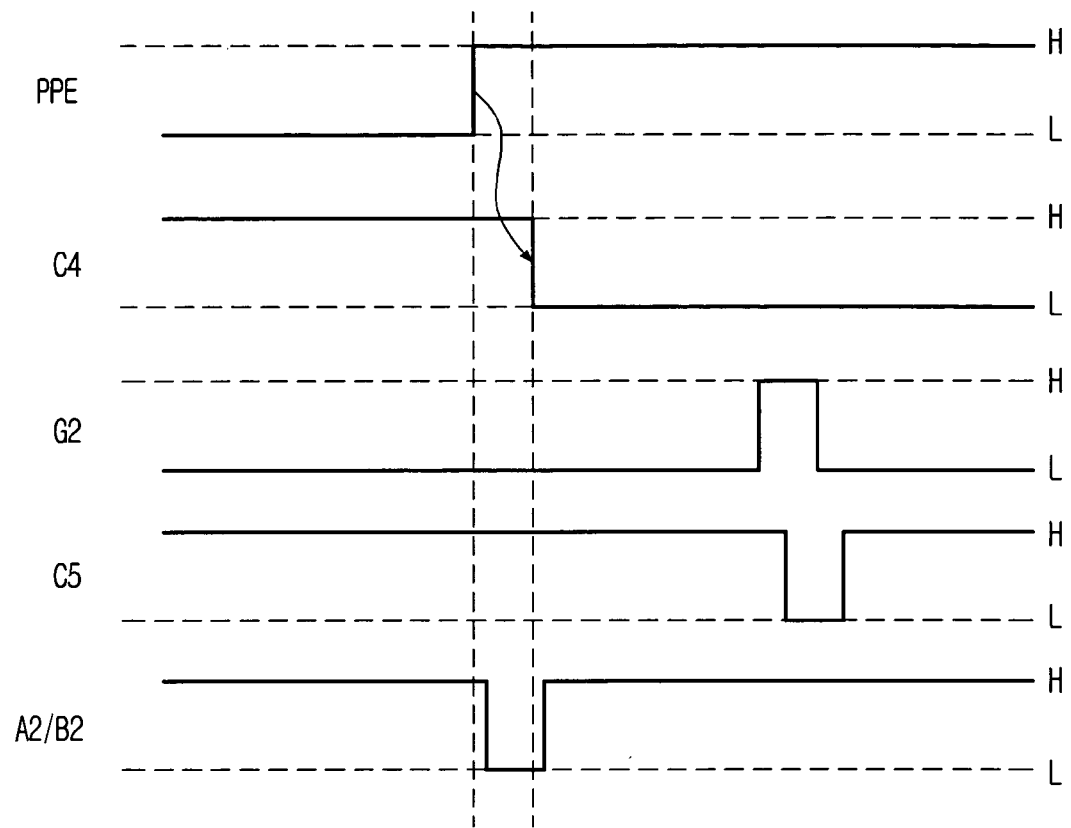

FIG. 5A is a waveform illustrating an operation of the first control signal generator 620 in the charge pump controlling unit 600 and FIG. 5B is a waveform illustrating an operation of the second control signal generator 640.

The operation of the charge pump controlling unit 600 will be described below with reference to FIGS. 5A and 5B.

First, when the high voltage maintains a level higher than the shifting reference voltage VR1, the level detecting unit 300 deactivates the detection signal PPE to a logic low level.

Accordingly, the delaying-inverting unit 622a of the edge detecting unit 622 delays the detection signal PPE by a predetermined time and inverts it. The NOR gate NR1 receiving the output C1 of the delaying-inverting unit 622a and the detection signal PPE is activated at a time point when the detection signal PPE is deactivate, and output a pulse signal C2 with a pulse width corresponding to a delay of the delaying-inverting unit 622a. Thus, the edge detecting unit 622 inverts the output of the NOR gate NR1 and generates a final output signal C3.

The output controlling unit 624 outputs the output C3 of the edge detecting unit 622 as the precharge control signals A1 and B1 in response to the pumping control signals G1 and G2 having a logic low level.

When the high voltage is dropped below the shifting reference voltage VR1 due to the current consumption of the high voltage VPP, the level detecting unit 300 activates the detection signal PPE to a logic high level.

The delaying-inverting unit 642 of the second control signal generating unit 640 delays the detection signal PPE by its own delay time. Thus, the second control signal generating unit 640 activates the initialization control signals A2 and B2 when all of the output of the delaying-inverting unit 642, the detection signal PPE and the inverted pumping control signals G1 and G2 have a logic low level.

In other words, the second control signal generating unit 640 is activated at a rising edge of the detection signal PPE and generates the initialization control signals A2 and B2 having the activation width corresponding to the delay time of the delaying-inverting unit 642.

Figure 6:
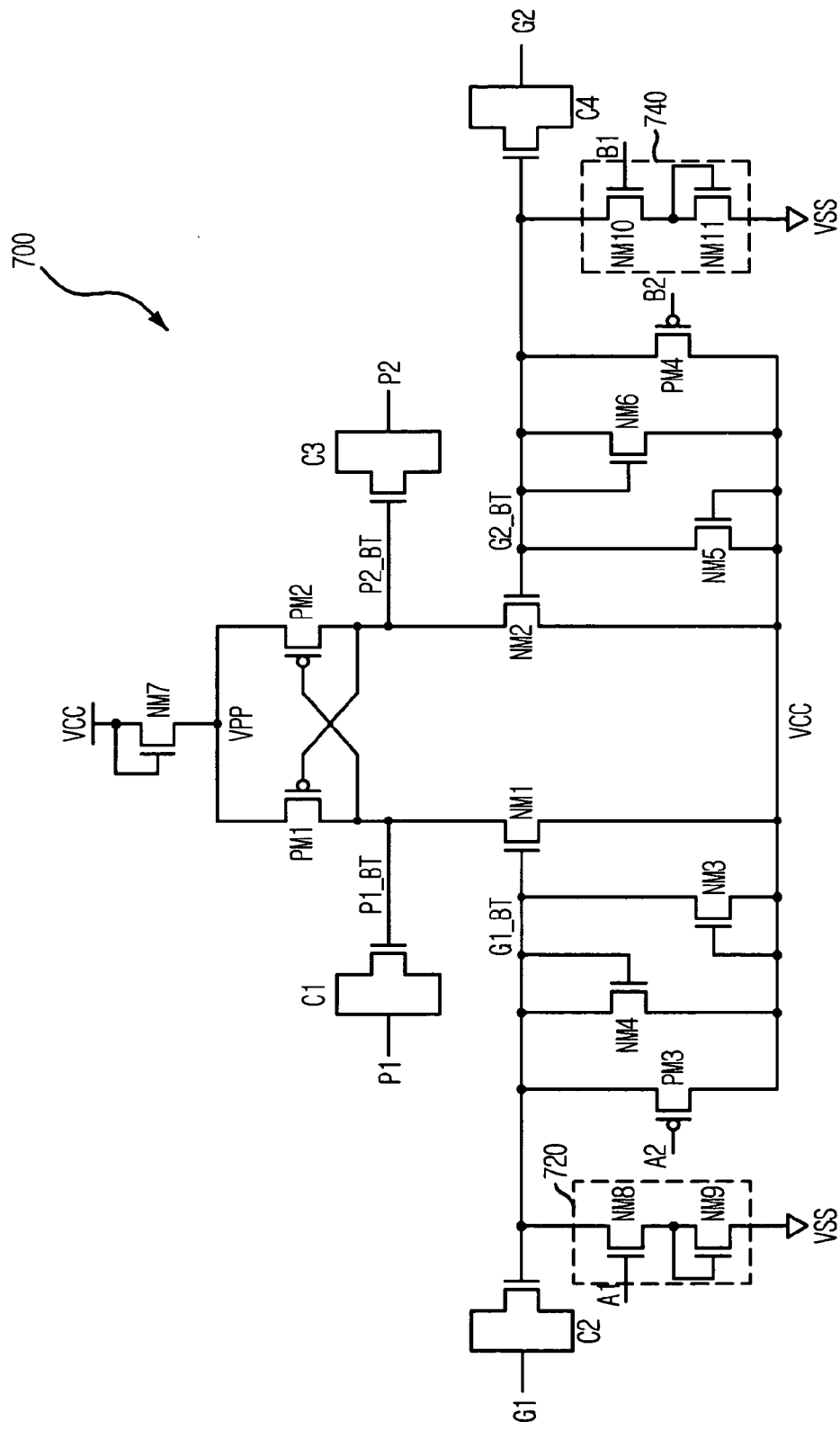
FIG. 6 is a circuit diagram of a charge pumping unit shown in FIG. 3.

FIG. 6 is a circuit diagram of the charge pumping unit 700 shown in FIG. 3.

Referring to FIG. 6, a capacitor C1 has one terminal receiving the pumping control signal P1 and the other terminal connected to a node P1_BT, and a capacitor C3 has one terminal receiving the pumping control signal P2 and the other terminal connected to a node P2_BT. A PMOS transistor PM2 has a gate receiving a voltage of the node P1_BT and a source-drain path between the high voltage VPP and the node P2_BT. A PMOS transistor PM1 has a gate receiving a voltage of the node P2_BT and a source-drain path between the high voltage VPP and the node P1_BT. A capacitor C2 has one terminal receiving the pumping control signal G1 and the other terminal connected to a node G1_BT. A capacitor C4 has one terminal receiving the pumping control signal G2 and the other terminal connected to a node G2_BT. An NMOS transistor NM1 has a gate receiving a voltage of the node G1_BT and a drain-source path between the node P1_BT and a power supply VCC. An NMOS transistor NM2 has a gate receiving a voltage of the node G2_BT and a drain-source path between the node P2_BT and the power supply voltage VCC. An NMOS transistor NM3 has a drain connected to the node G1_BT, and a source and gate connected to the source of the NMOS transistor NM11. An NMOS transistor NM4 has a drain and a gate connected to the node G1_BT, and a source connected to the source of the NMOS transistor NM1. An NMOS transistor NM5 has a drain connected to the node G2_BT, and a source and a gate connected to the source of the NMOS transistor NM2. An NMOS transistor NM6 has a drain and a gate connected to the node G2_BT, and a source connected to the source of the NMOS transistor NM2. A first precharge unit 720 precharges the node G1_BT in response to the precharge control signal A1, and a second precharge unit 740 precharges the node G2_BT in response to the precharge control signal B1. A first initialization unit PM3 initializes the node G1_BT to the power supply voltage VCC in response to the initialization control signal A2, and a second initialization unit PM4 initializes the node G2_BT to the power supply voltage VCC in response to the initialization control signal B2.

The first precharge unit 720 includes an NMOS transistor NM8 having a gate receiving the precharge control signal A1 and a drain connected to the node G1_BT, and an NMOS transistor NM9 having a gate and a drain connected to a source of the NMOS transistor NM8 and a source connected to the power supply voltage VCC.

The second precharge unit 740 includes an NMOS transistor NM10 having a gate receiving the precharge control signal B1 and a drain connected to the node G2_BT, and an NMOS transistor NM11 having a gate and a drain connected to a source of the NMOS transistor NM10 and a source connected to the power supply voltage VCC.

When there is no change in the level of the high voltage VPP, the charge pumping unit 700 operates in response to the control signals A1, A2, B1 and B2 generated from the charge pump controlling unit 600.

The charge pump controlling unit 600 activates the precharge control signals A1 and B1 in response to the deactivation of the detection signal PPE.

Then, the first and second precharge units 620 and 640 receiving the precharge control signals A1 and B1 precharges the corresponding nodes G1_BT and G2_BT to the ground voltage VSS.

Accordingly, the NMOS transistors NM4 and NM6 receiving the voltages of the nodes G1_BT and G2_BT through their gates are not turned on even when the level of the power supply voltage VCC is dropped. In the prior art, the leakage path is formed between the VPP terminal and the VCC terminal when the NMOS transistors NM4 and NM6 are turned on. However, in the present invention, the leakage path is opened regardless of the level drop of the power supply voltage VCC due to the precharge of the nodes G1_BT and G2_BT.

Then, if the level of the high voltage VPP is dropped and thus the level detecting unit 300 activates the detection signal PPE to a logic high level, the charge pump controlling unit 600 activates the initialization control signals A2 and B2.

The PMOS transistors PM3 and PM4 are turned off in response to the initialization control signals A2 and B2, so that the corresponding nodes G1_BT and G2_BT are initialed to the power supply voltage VCC.

Like this, by initializing the nodes G1_BT and G2_BT to the power supply voltage VCC just before the charge pumping unit 700 starts to be driven, the charge pumping unit 700 operates in the same manner as that of the prior art during the activation period of the level detecting unit 300.

When the level of the high voltage VPP is dropped below the level of the shifting reference voltage VR1, the level detecting unit 300 detects the level drop to activates the detection signal PPE. Since the subsequent operations of the oscillator 400, the pumping control signal generating unit 500, and the charge pumping unit 700 are equal to those of the prior art, a detailed description thereof will be omitted.

When the charge pumping operation is not performed because there is no change in the level of the high voltage, the charge pumping unit is precharged for preventing the occurrence of the leakage path between the VCC terminal and the VPP terminal and is restored the just before the precharge pumping operation starts, thereby obtaining the stable pumping operation.

As described above, when the high voltage is maintained at a desired level and thus the substantial charge pumping operation is not performed, the charge pumping unit is precharged. Thus, the occurrence of the leakage current in the high voltage is prevented, so that the level of the high voltage is maintained stably.

The present application contains subject matter related to Korean patent application No. 2004-27372, filed in the Korean Intellectual Property Office on Mar. 31, 2005, the entire contents of which is incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator comprising:
    a charge pumping unit for pumping an external voltage to generate a high voltage higher than the external voltage;
    a level detecting unit for detecting a level drop of the high voltage with respect to a reference voltage and outputting a detection signal;
    an oscillating unit for generating an oscillation signal in response to the detection signal;
    a pumping control signal generating unit for controlling a driving of the charge pumping unit in response to the oscillation signal; and
    a charge pump controlling unit for precharging the charge pumping unit by detecting a driving end of the charge pumping unit and for initializing the charge pumping unit by detecting a driving start of the charge pumping units,
    wherein the charge pump controlling unit includes:
    a first control signal generating unit for generating first and second precharge control signals to open a path where a leakage current occurs in the charge pumping unit; and
    a second control signal generating unit for generating first and second initialization control signals to initialize the charge pumping unit.

2. The internal voltage generator as recited in claim 1, wherein the first control signal generating unit includes:
    an edge detecting unit for detecting a deactivation of the detection signal; and
    an output controlling unit for outputting output signals of the edge detecting unit as the first and second precharge control signals in response to the first and second pumping control signals.

3. The internal voltage generator as recited in claim 2, wherein the edge detecting unit includes:
    a delaying-inverting unit for delaying and inverting the detection signal;
    a first NOR gate receiving an output of the delaying-inverting unit and the detection signal; and
    an inverter for inverting an output of the first NOR gate.

4. The internal voltage generator as recited in claim 3, wherein the output controlling unit includes:
    a second NOR gate receiving an output of the edge detecting unit and the first pumping control signal and outputting the first precharge control signal; and
    a third NOR gate receiving the output of the edge detecting unit and the second pumping control signal and outputting the second precharge control signal.

5. The internal voltage generator as recited in claim 1, wherein the second control signal generating unit detects a driving start of the charge pumping unit through an activation of the detection signal and generates the first and second initialization control signals for initializing the charge pumping unit.

6. The internal voltage generator as recited in claim 5, wherein the second control signal generating unit includes:
    a delaying-inverting unit for delaying and inverting the detection signal;
    a first NAIND gate receiving an output of the delaying-inverting unit, the detection signal and an inverted first pumping control signal and outputting the first initialization control signal; and
    a second NAND gate receiving the output of the delaying-inverting unit, the detection signal and an inverted second pumping control signal and outputting the second initialization control signal.

7. The internal voltage generator as recited in claim 6, wherein the charge pumping unit includes:
    a first capacitor having one terminal receiving a third pumping control signal and the other terminal connected to a first node;
    a second capacitor having one terminal receiving a fourth pumping control signal and the other terminal connected to a second node;
    a first PMOS transistor having a gate receiving a voltage of the first node and a source-drain path between the high voltage and the second node;
    a second PMOS transistor having a gate receiving a voltage of the second node and a source-drain path between the high voltage and the first node;
    a third capacitor having one terminal receiving the first pumping control signal and the other terminal connected to a third node;
    a fourth capacitor having one terminal receiving the second pumping control signal and the other terminal connected to a fourth node;
    a first NMOS transistor having a gate receiving a voltage of the third node and a drain-source path between the first node and the power supply voltage;
    a second NMOS transistor having a gate receiving a voltage of the fourth node and a drain-source path between the second node and the power supply voltage;
    a third NMOS transistor having a drain connected to the third node, and a source and gate connected to the source of the first NMOS transistor;
    a fourth NMOS transistor having a drain and a gate connected to the third node, and a source connected to the source of the first NMOS transistor;
    a fifth NMOS transistor having a drain connected to the fourth node, and a source and a gate connected to the source of the second NMOS transistor;
    a sixth NMOS transistor having a drain and a gate connected to the fourth node, and a source connected to the source of the second NMOS transistor;

a first precharge unit for precharging the third node in response to the first precharge control signal;
a second precharge unit for precharging the fourth node in response to the second precharge control signal;
a first initialization unit for initializing the third node to the power supply voltage in response to the first initialization control signal; and
a second initialization unit for initializing the fourth node to the power supply voltage in response to the second initialization control signal.

8. The internal voltage generator as recited in claim 7, wherein the first initialization unit is a third PMOS transistor having a gate receiving the first initialization control signal and a source-drain path between the third node and the power supply voltage, and the second initialization unit is a fourth PMOS transistor having a gate receiving the second initialization control signal and a source-drain path between the fourth node and the power supply voltage.

* * * * *

UNITED STATES PATENT AND TRADEMARK OFFICE
CERTIFICATE OF CORRECTION

PATENT NO. : 7,304,531 B2 Page 1 of 1
APPLICATION NO. : 11/181008
DATED : December 4, 2007
INVENTOR(S) : Yong-Kyu Kim It is certified that error appears in the above-identified patent and that said Letters Patent is hereby corrected as shown below:

In Claim 6, line 20, please delete "NAIND" and insert -- NAND --.

Signed and Sealed this

Thirtieth Day of June, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,304,531 B2 | Page 1 of 1 |
| APPLICATION NO. | : 11/181008 | |
| DATED | : December 4, 2007 | |
| INVENTOR(S) | : Yong-Kyu Kim | |

It is certified that error appears in the above-identified patent and that said Letters Patent is hereby corrected as shown below:

Column 8, in Claim 6, line 20, please delete "NAIND" and insert -- NAND --.

This certificate supersedes the Certificate of Correction issued June 30, 2009.

Signed and Sealed this

Twenty-eighth Day of July, 2009

JOHN DOLL
*Acting Director of the United States Patent and Trademark Office*